(12) United States Patent
Tsai et al.

(10) Patent No.: US 8,561,276 B2
(45) Date of Patent: Oct. 22, 2013

(54) SPUTTERING APPARATUS

(75) Inventors: Tai-Sheng Tsai, Taipei Hsien (TW); Hou-Yao Lin, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 605 days.

(21) Appl. No.: 12/857,572

(22) Filed: Aug. 17, 2010

(65) Prior Publication Data

US 2011/0247931 A1 Oct. 13, 2011

(30) Foreign Application Priority Data

Apr. 8, 2010 (TW) ................................ 99110830 A

(51) Int. Cl.
*B23P 11/00* (2006.01)
(52) U.S. Cl.
USPC ......... 29/281.1; 29/281.3; 269/287; 269/903; 269/21
(58) Field of Classification Search
USPC ............. 29/281.1, 281.3, 281.5; 269/287, 21, 269/20, 900, 903
See application file for complete search history.

(56) References Cited

U.S. PATENT DOCUMENTS

| | | | |
|---|---|---|---|
| 6,238,527 B1* | 5/2001 | Sone et al. | 204/192.12 |
| 6,764,713 B2* | 7/2004 | Wytman | 427/123 |
| 8,356,808 B2* | 1/2013 | Macionczyk | 269/58 |
| 2011/0247931 A1* | 10/2011 | Tsai et al. | 204/298.28 |
| 2012/0009829 A1* | 1/2012 | Maebashi et al. | 439/886 |

* cited by examiner

*Primary Examiner* — Lee D Wilson
(74) *Attorney, Agent, or Firm* — Altis & Wispro Law Group, Inc.

(57) ABSTRACT

A sputtering bracket includes a curved plate body, a plurality of frames, and a plurality of fastening members. The body defines a plurality of through holes and has an inner concave side. The frames are pivotally connected with the curved plate body and received in the respective through holes. Each frame is rotatable relative to the curved plate body such that either one of opposite sides thereof can be exposed at the inner concave side. The fastening members are mounted on the curved plate body body, and are spring-loaded for resilient engagement with the respective frames.

8 Claims, 7 Drawing Sheets

SPUTTERING APPARATUS

BACKGROUND

1. Technical Field

The present disclosure relates to sputtering technology, and particularly, to a sputtering bracket and a related sputtering apparatus.

2. Description of Related Art

For purposes of improving optical performance, optical elements, for example, lenses generally have films deposited on opposite surfaces thereof using a sputtering process. During the sputtering process, lenses are fixed on a lens tray. After depositing a film on a surface of the lenses, the lenses are manually turned over one-by-one to deposit a film on another surface of the lenses, which risks contamination of the lenses. Therefore, it is desired to provide a sputtering bracket and a sputtering apparatus having the same.

BRIEF DESCRIPTION OF THE DRAWINGS

Many aspects of the present sputtering bracket and sputtering apparatus can be better understood with reference to the following drawings. The components in the drawings are not necessarily drawn to scale, the emphasis instead being placed upon clearly illustrating the principles of the present sputtering bracket and sputtering apparatus. Moreover, in the drawings, like reference numerals designate corresponding parts throughout the several views.

DETAILED DESCRIPTION

Reference will now be made to the drawings to describe in detail of the exemplary embodiment of the sputtering bracket and the sputtering apparatus.

Figure 1:
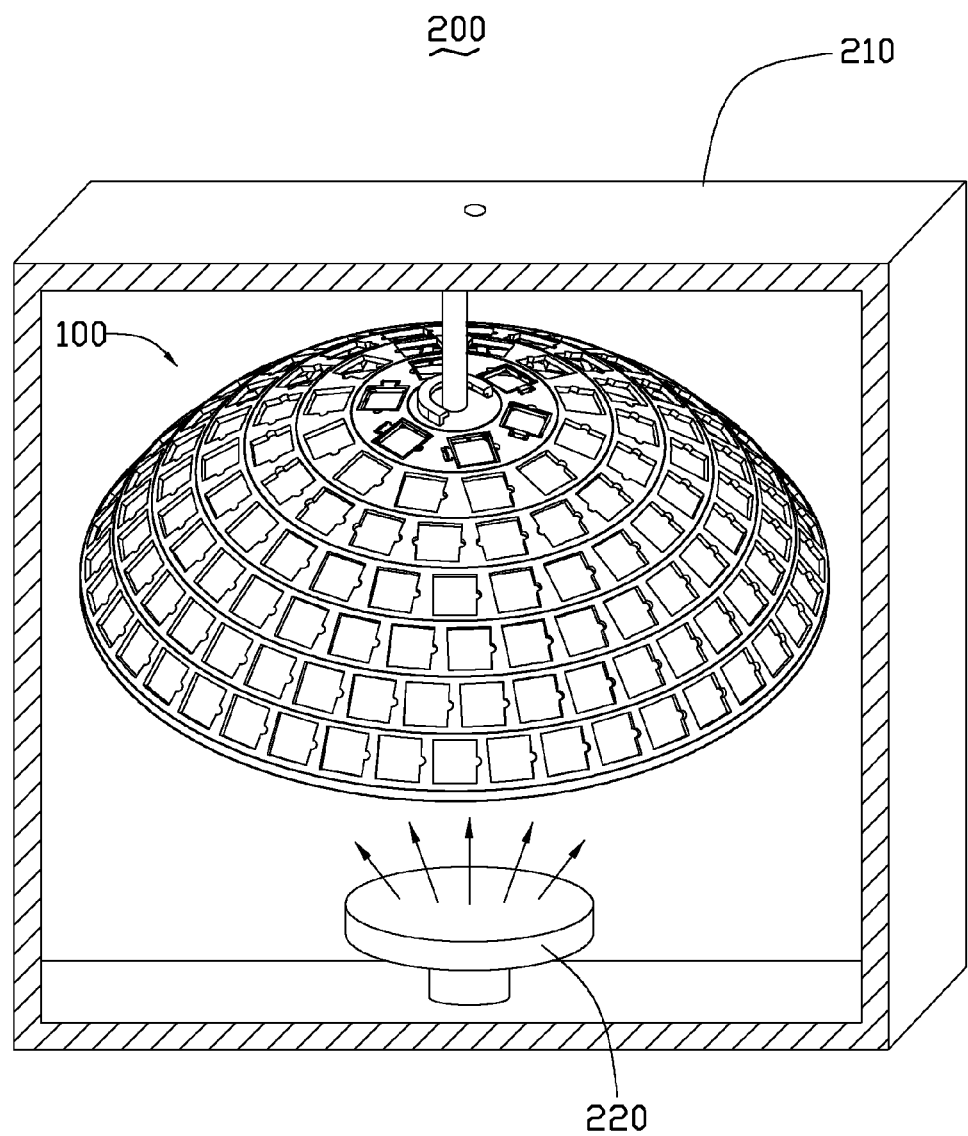
FIG. 1 shows a sputtering apparatus in accordance with an exemplary embodiment, the sputtering apparatus includes a sputtering bracket.

Referring to FIG. 1, an exemplary sputtering apparatus 200 includes a vacuum chamber 210 and a sputtering bracket 100 accommodated in the vacuum chamber 210. The sputtering bracket 100 is dome-shaped, and is rotatable around its central axis. In addition, the sputtering apparatus 200 further includes a target 220 positioned under the sputtering bracket 100 for ejecting atoms thereonto.

Figure 2:
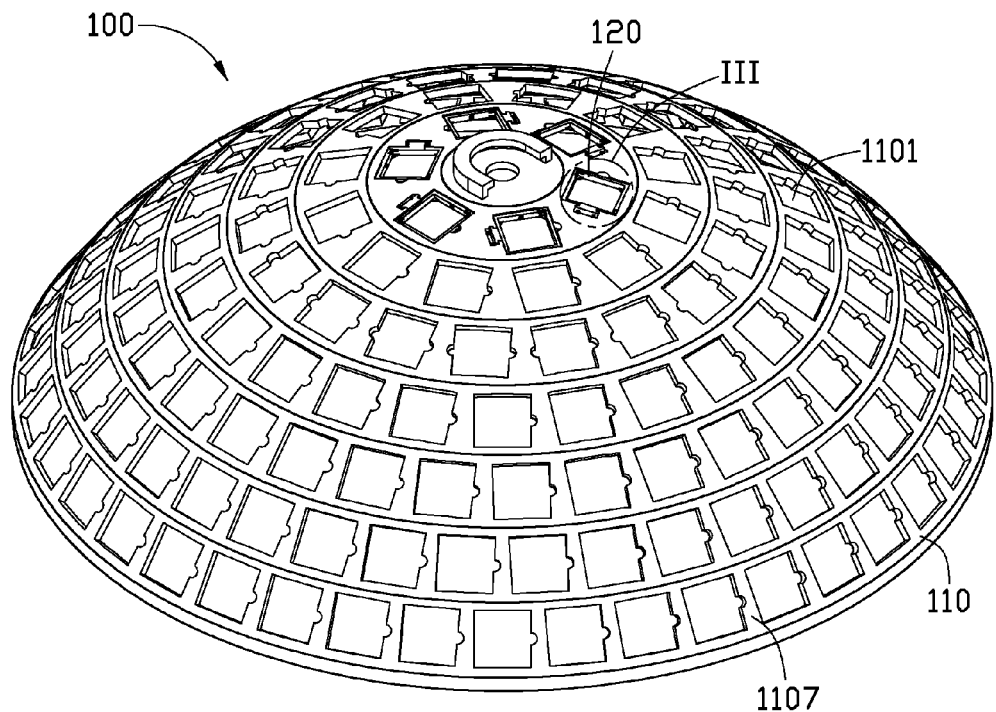
FIG. 2 is an isometric view of the sputtering bracket of FIG. 1.

Referring to FIG. 2, in detail, the sputtering bracket 100 includes a curved plate body 110, a plurality of rotatable frames 120, and a plurality of fastening members 140.

The curved plate body 110 is made of a highly thermally conductive metallic material, such as copper, aluminum, or stainless steel. The curved plate body 110 has an outer surface 1107, an inner concave side (not shown) opposite to the outer surface 1107, and defines a plurality of through holes 1101. The through holes 1101 are arranged on a plurality of imaginary circles each coaxial with the curved plate body 110.

Figure 3:
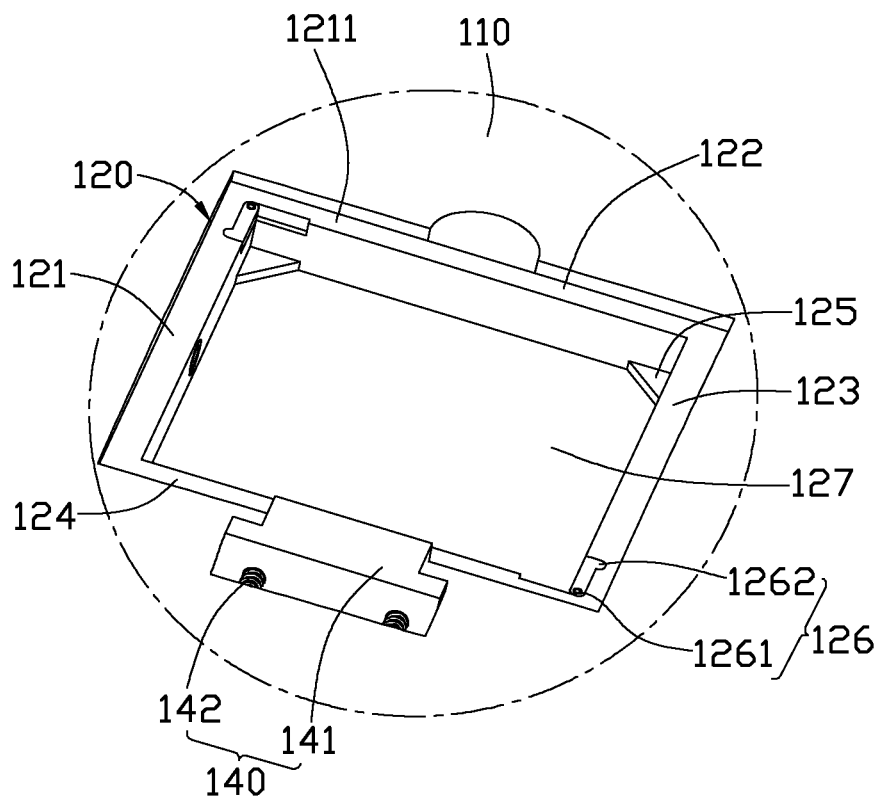
FIG. 3 is an enlarged view of a circled portion of the sputtering bracket of FIG. 1, the sputtering bracket including a rotatable frame and a fastening member.
Figure 4:
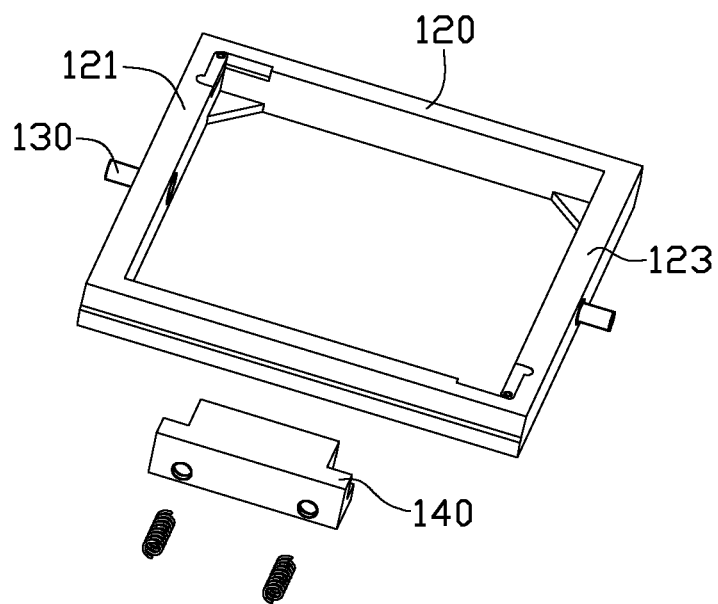
FIG. 4. is an exploded view of the circled portion of the sputtering bracket of FIG. 3, the fastening member including a fastener.
Figure 4:
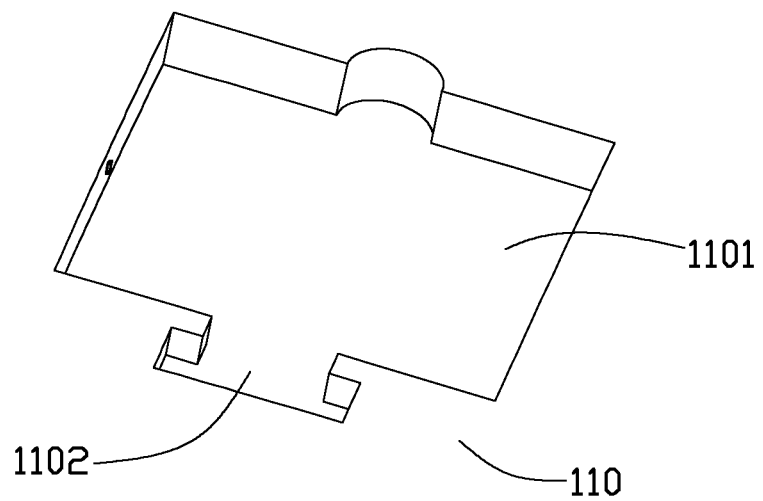

The rotatable frames 120 are made of a high thermally conductive metallic material, such as copper, aluminum, or stainless steel. The rotatable frames 120 also can be made of plastic, such as Polycarbonate (PC), Acrylonitrile Butadiene Styrene (ABS), etc. Each rotatable frame 120 is pivotally connected with the curved plate body 110 in respective through hole 1101. As such, the rotatable frames 120 are capable of rotating freely about a rotating axis relative to the curved plate body 110 in the through holes 1101. Referring to FIGS. 2-4, the curved plate body 110 also defines a plurality of slots 1102 communicated with respective through hole 1101. Referring to FIG. 2, the six through holes 1101, which are arranged on an imaginary circle adjacent to the top of the sputtering bracket 100, respectively accommodates a rotatable frame 120.

Figure 7:
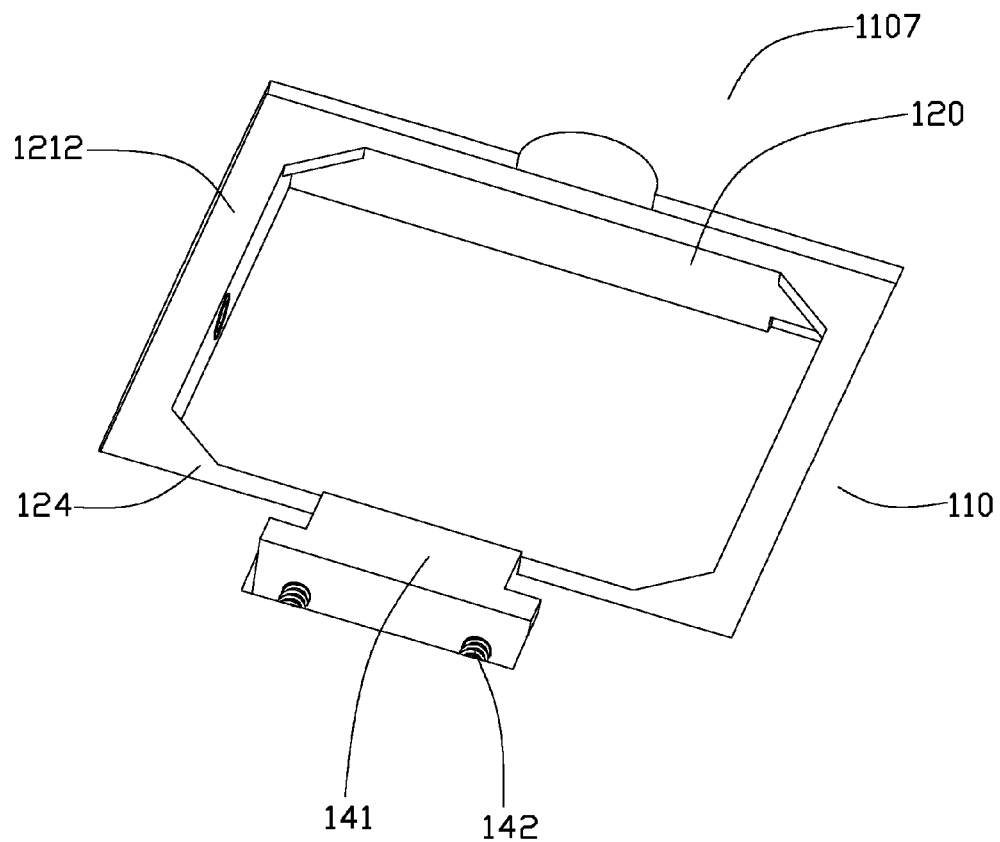
FIG. 7 shows the rotatable frame in a second position.

Referring to FIG. 3, each rotatable frame 120 is rectangular, and includes a first bar 121, a second bar 122, a third bar 123 parallel to the first bar 121, and a fourth bar 124 parallel to the second bar 122, which are end-to-end connected with each other. The four bars cooperatively form a room 127 for accommodating a lens tray. Referring to FIGS. 3 and 7, each bar has a first surface 1211 and a second surface 1212 opposite to the first surface 1211. In a fastened state, the first surface 1211 faces the outer surface 1107 of the sputtering bracket 110. Additionally, the rotatable frame 120 includes four substrate supporting elements 125 and two securing elements 126. Each supporting element 125 is a gusset, extends from the bars inwardly on respective corner of the rotatable frame 120. Each securing element 126 includes a first end 1261 and a second end 1262 opposite to the first end 1261. The first end 1261 is fixed on the first surface 1211 of the rotatable frame 120. The second end 1262 is movable relative to the first end 1261 and beyond the through hole 1101. The second ends 1262 are configured for cooperatively sandwiching the lens tray in the rotatable frame 120 with the supporting elements 125. Referring to FIGS. 3 and 4, the rotatable frame 120 is pivotally connected to the curved plate body 110 with two shafts 130 at the intermediate portion of first bar 121 and the third bar 123. The two shafts 130 are coaxial with each other. Particularly, the two shafts 130 are spring.

Figure 5:
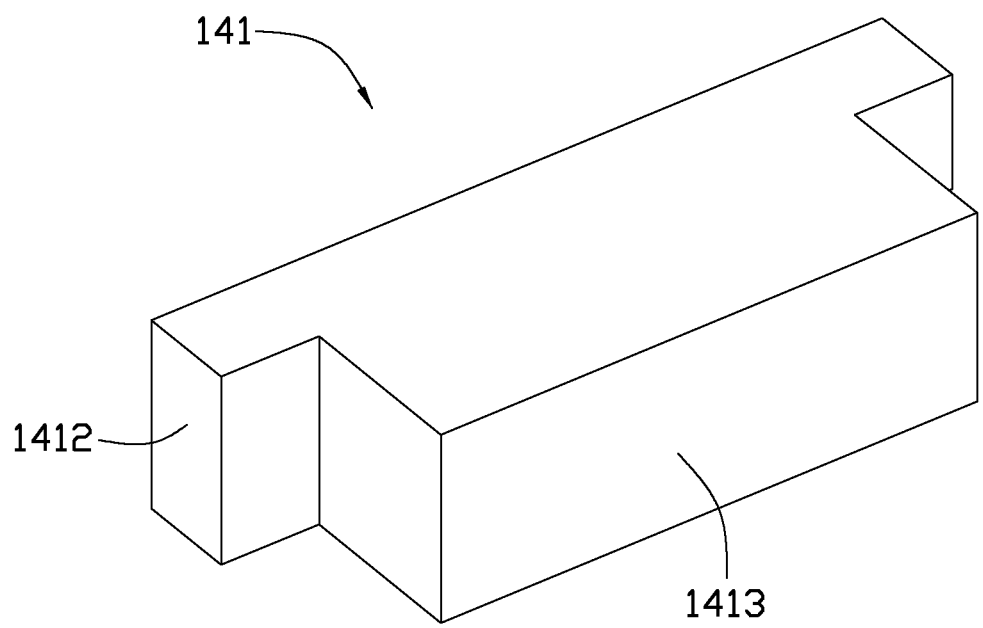
FIG. 5 is an isometric view of the fastener of FIG. 4.

Referring to FIGS. 3-5, the fastening member 140 is movably accommodated in the slot 1102, and includes a fastener 141 and a resilient element 142. The fastener 141 includes a first portion 1412 and a second portion 1413 perpendicularly extending from the first portion 1412. The second portion 1413 is narrower than the first portion 1412. That is, the fastener 141 is T-shaped. The resilient element 142 is distortable under an external force and recoverable to its original shape when withdrawing the external force. One end of the resilient element 142 is fixed on the curved plate body 110 and another end of the resilient element 142 is fixed on the first portion 1412 of the fastener 141. As such, the fastener 141 is movable relative to the curved plate body 110 by changing the length of the resilient element 142.

Figure 6:
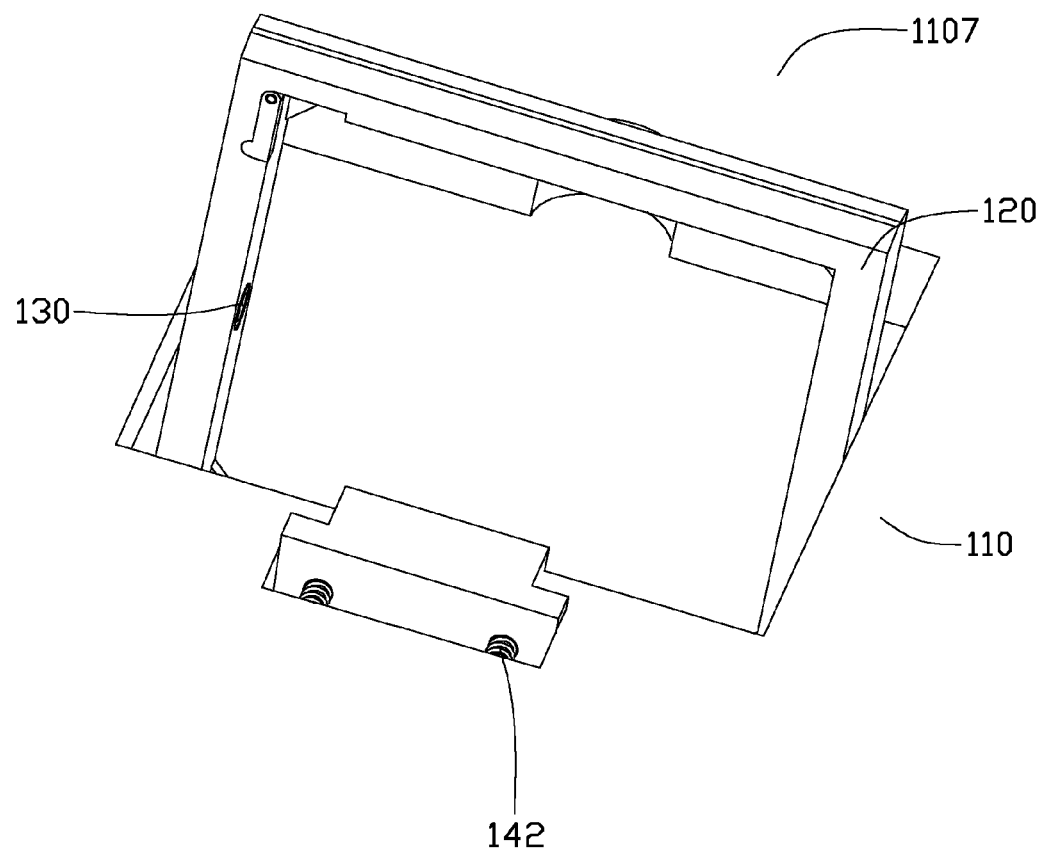
FIG. 6 shows the rotatable frame in a first position.

Referring to FIG. 3, the rotatable frame 120 is steadily fastened in the through hole 1101 with the fastener 141 pushing the fourth bar 124 of the rotatable frame 120. It is understood that the resilient element 142 is compressed between the fastener 141 and the curved plate body 110. Under this condition, a typical sputtering process for instance, a plurality of lens trays with lenses can be put into the through holes 1101 and sandwiched by the securing tabs 126 and the supporting elements 125. Thereafter, a film layer can be formed on a first surface of the lenses. Referring to FIG. 6, when pushing the fastener 141 to compress the resilient element 142, the rotatable frame 120 rotates around the shafts 130 in the through hole 1101. Referring to FIG. 7, when the second surface 1212 faces the outer surface 1107 of the curved plate body 110, the resilient element 142 recovers to its former length, and the fastener 141 fastens the rotatable frame 120 at the fourth bar 124 again. Thus, the lens tray in the rotatable frame 120 is turned over, and a film layer can be sequentially formed on a second surface of the lenses.

The sputtering bracket 100 has following advantages. On one side, the sputtering bracket 100 employs rotatable frames 120 for accommodating lens trays. It allows for simultaneously turning over multiple lenses in the lens tray, resulting in a reduction of time. Additionally, the operator is able to turn the rotatable frame 120 over with multiple lenses contained instead of manually turning over individual lenses one by one, significantly reducing the risk of contamination.

In an alternated embodiment, the first end 1261 of the securing tabs 126 is fixed on the outer surface 1107 of the curved plate body 110 in a manner that the second end 1262 is capable of moving into the through hole 1101.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A sputtering apparatus, comprising:
   a sputtering chamber;
   a target accommodated in the sputtering chamber; and
   a sputtering bracket positioned over the target, the sputtering bracket comprising:
      a curved plate body defining a plurality of through holes, the curved plate body having an inner concave side;
      a plurality of frames pivotally connected with the curved plate body and received in the respective through holes, each frame being rotatable relative to the curved plate body such that either one of opposite sides thereof can be exposed at the inner concave side; and
      a plurality of fastening members mounted on the curved plate body body, the fastening members being spring-loaded for resilient engagement with the respective frames.

2. The sputtering apparatus of claim 1, wherein the frame comprises a plurality of bars connected end to end, and a plurality of substrate supporting elements for mounting substrates thereon.

3. The sputtering apparatus of claim 2, further comprising a plurality of securing tabs, and each securing tab is pivotally coupled to the curved plate body.

4. The sputtering apparatus of claim 2, further comprising a plurality of securing tabs, and each securing tab is pivotally coupled to the corresponding bar.

5. The sputtering apparatus of claim 1, further comprising a plurality of slots, the slots communicating with the respective through holes, the fastening members movably accommodated in the respective slots.

6. The sputtering apparatus of claim 5, wherein each of the fastening members comprising a fastener and a spring element, the spring element is interconnected between the curved plate body and the fastener.

7. A sputtering apparatus, comprising:
   a sputtering chamber;
   a sputtering bracket received in the sputtering chamber, the sputtering bracket comprising:
      a dome-shaped plate defining a plurality of through holes, the dome-shaped plate having an inner concave side;
      a plurality of frames pivotally connected with the curved plate body body and received in the respective through holes, each frame being rotatable relative to the dome-shaped plate such that either one of opposite sides thereof can be exposed at the inner concave side; and
      a plurality of spring-loaded fastening members mounted on the dome-shaped body, the fastening members configured for positioning the frames in the respective through holes; and
   a target received in the sputtering chamber facing the inner concave side of the dome-shaped plate.

8. The sputtering apparatus of claim 7, wherein each frame being rotatable about an rotating axis relative to the dome-shaped plate, the rotating axes generally extending from a periphery of the dome-shaped plate to a central axis thereof.

* * * * *